United States Patent
Furukawa et al.

(10) Patent No.: US 7,655,985 B2
(45) Date of Patent: Feb. 2, 2010

(54) METHODS AND SEMICONDUCTOR STRUCTURES FOR LATCH-UP SUPPRESSION USING A CONDUCTIVE REGION

(75) Inventors: Toshiharu Furukawa, Essex Junction, VT (US); David Vaclav Horak, Essex Junction, VT (US); Charles William Koburger, III, Delmar, NY (US); Jack Allan Mandelman, Flat Rock, NC (US); William Robert Tonti, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/125,381

(22) Filed: May 22, 2008

(65) Prior Publication Data
US 2008/0217698 A1    Sep. 11, 2008

Related U.S. Application Data

(62) Division of application No. 11/340,752, filed on Jan. 26, 2006, now Pat. No. 7,491,618.

(51) Int. Cl.
*H01L 21/8238* (2006.01)

(52) U.S. Cl. .............. 257/372; 438/361; 438/199; 267/E27.063

(58) Field of Classification Search .............. 257/372
See application file for complete search history.

(56) References Cited

U.S. PATENT DOCUMENTS

| | | | |
|---|---|---|---|
| 4,454,647 A * | 6/1984 | Joy et al. | 438/361 |
| 4,495,025 A | 1/1985 | Haskell | |
| 4,609,934 A | 9/1986 | Haskell | |
| 4,615,104 A | 10/1986 | Kameyama et al. | |
| 4,948,624 A | 8/1990 | Rivaud et al. | |
| 4,956,693 A | 9/1990 | Sawahata et al. | |
| 5,015,594 A | 5/1991 | Chu et al. | |
| 5,112,771 A | 5/1992 | Ishii et al. | |
| 5,130,268 A | 7/1992 | Liou | |
| 5,183,775 A | 2/1993 | Levy | |

(Continued)

FOREIGN PATENT DOCUMENTS

JP    04037152    2/1992

(Continued)

OTHER PUBLICATIONS

Office Action issued in related U.S. Appl. No. 11/340,737; dated Mar. 27, 2007; 5 pages; USPTO.

(Continued)

*Primary Examiner*—Thao X Le
*Assistant Examiner*—Kimberly Trice
(74) *Attorney, Agent, or Firm*—Wood, Herron & Evans, LLP

(57) ABSTRACT

Semiconductor structures and methods for suppressing latch-up in bulk CMOS devices. The semiconductor structure comprises first and second adjacent doped wells formed in the semiconductor material of a substrate. A trench, which includes a base and first sidewalls between the base and the top surface, is defined in the substrate between the first and second doped wells. The trench is partially filled with a conductor material that is electrically coupled with the first and second doped wells. Highly-doped conductive regions may be provided in the semiconductor material bordering the trench at a location adjacent to the conductive material in the trench.

10 Claims, 14 Drawing Sheets

U.S. PATENT DOCUMENTS

| | | | |
|---|---|---|---|
| 5,393,693 | A | 2/1995 | Ko et al. |
| 5,445,989 | A | 8/1995 | Lur et al. |
| 5,536,675 | A | 7/1996 | Bohr |
| 5,658,816 | A | 8/1997 | Rajeevakumar |
| 5,783,476 | A | 7/1998 | Arnold |
| 5,807,784 | A | 9/1998 | Kim |
| 5,844,294 | A | 12/1998 | Kikuchi |
| 5,895,251 | A | 4/1999 | Kim |
| 5,895,253 | A | 4/1999 | Akram |
| 5,937,286 | A | 8/1999 | Abiko |
| 5,972,776 | A | 10/1999 | Bryant |
| 5,994,200 | A | 11/1999 | Kim |
| 6,001,709 | A | 12/1999 | Chuang et al. |
| 6,018,174 | A | 1/2000 | Schrems et al. |
| 6,137,152 | A | 10/2000 | Wu |
| 6,207,532 | B1 | 3/2001 | Lin et al. |
| 6,214,696 | B1 | 4/2001 | Wu |
| 6,294,419 | B1 | 9/2001 | Brown et al. |
| 6,365,952 | B1 | 4/2002 | Akram |
| 6,432,798 | B1 | 8/2002 | Liu et al. |
| 6,455,363 | B1 | 9/2002 | Puchner et al. |
| 6,476,445 | B1 | 11/2002 | Brown et al. |
| 6,518,641 | B2 | 2/2003 | Mandelman et al. |
| 6,576,558 | B1 | 6/2003 | Lin |
| 6,590,271 | B2 | 7/2003 | Liu et al. |
| 6,635,543 | B2 | 10/2003 | Furukawa et al. |
| 6,645,835 | B1 | 11/2003 | Yamoto et al. |
| 6,653,678 | B2 | 11/2003 | Chidambarrao et al. |
| 6,670,234 | B2 | 12/2003 | Hsu et al. |
| 6,689,655 | B2 | 2/2004 | Coronel et al. |
| 6,828,191 | B1 | 12/2004 | Wurster et al. |
| 6,830,962 | B1 | 12/2004 | Guarini et al. |
| 6,875,663 | B2 | 4/2005 | Iwamatsu et al. |
| 6,900,091 | B2 | 5/2005 | Williams et al. |
| 6,903,384 | B2 | 6/2005 | Hsu et al. |
| 6,905,944 | B2 | 6/2005 | Chudzik et al. |
| 6,984,580 | B2 | 1/2006 | Dostalik et al. |
| 6,995,054 | B2 | 2/2006 | Oda et al. |
| 7,045,397 | B1 | 5/2006 | Yu et al. |
| 7,078,324 | B2 | 7/2006 | Dudek et al. |
| 7,081,378 | B2 | 7/2006 | Zheng et al. |
| 7,122,867 | B2 | 10/2006 | Liou |
| 7,176,104 | B1 | 2/2007 | Chen et al. |
| 7,276,768 | B2 | 10/2007 | Furukawa et al. |
| 2003/0017710 | A1 | 1/2003 | Yang et al. |
| 2003/0170964 | A1 | 9/2003 | Kao et al. |
| 2004/0102017 | A1 | 5/2004 | Chang et al. |
| 2005/0004595 | A1 | 1/2005 | Boyle et al. |
| 2005/0020003 | A1 | 1/2005 | Johansson et al. |
| 2005/0045952 | A1 | 3/2005 | Chatty et al. |
| 2005/0085028 | A1 | 4/2005 | Chatty et al. |
| 2005/0142803 | A1 | 6/2005 | Chun |
| 2005/0179111 | A1 | 8/2005 | Chao |
| 2005/0191812 | A1 | 9/2005 | Pritchard et al. |
| 2006/0003596 | A1 | 1/2006 | Fucsko et al. |
| 2006/0065923 | A1* | 3/2006 | Pfirsch ............... 257/328 |
| 2006/0113589 | A1* | 6/2006 | Jones ................ 257/330 |
| 2006/0134882 | A1 | 6/2006 | Zhang |
| 2007/0158755 | A1* | 7/2007 | Chang et al. .......... 257/374 |
| 2007/0158779 | A1 | 7/2007 | Cannon et al. |
| 2007/0170518 | A1 | 7/2007 | Furukawa et al. |
| 2007/0170543 | A1 | 7/2007 | Furukawa et al. |
| 2007/0194403 | A1 | 8/2007 | Cannon et al. |
| 2007/0241409 | A1 | 10/2007 | Furukawa et al. |
| 2008/0057671 | A1 | 3/2008 | Furukawa et al. |
| 2008/0157202 | A1 | 7/2008 | Cannon et al. |
| 2008/0164494 | A1 | 7/2008 | Pagette et al. |
| 2008/0203492 | A1 | 8/2008 | Cannon et al. |
| 2008/0203522 | A1 | 8/2008 | Mandelman et al. |
| 2008/0217690 | A1 | 9/2008 | Mandelman et al. |
| 2008/0230852 | A1 | 9/2008 | Yu et al. |
| 2008/0237663 | A1 | 10/2008 | Hanafi |
| 2008/0242016 | A1 | 10/2008 | Cannon et al. |
| 2008/0265338 | A1 | 10/2008 | Yu et al. |
| 2008/0268610 | A1 | 10/2008 | Furukawa et al. |

OTHER PUBLICATIONS

Notice of Allowance issued in related U.S. Appl. No.11/340,737; dated Jun. 1, 2007; 4 pages; USPTO.
Office Action issued in related U.S. Appl. No. 11/340,752; dated Jun. 17, 2008; 35 pages; USPTO.
M. Yang et al., "High Performance CMOS Fabricated on Hybrid Substrate With Different Crystal Orientations," IEEE, 2003 (4 pages).
M. Yang et al., "On the Integration of CMOS with Hybrid Crystal Orientations," IEEE, 2004 Symposium on VLSI Technology Digest of Technical Papers (2 pages).
Office Action issued in a related U.S. Appl. No. 11/360,345, dated Aug. 29, 2008; 12 pages; U.S. Patent and Trademark Office.
U.S. Patent and Trademark Office, Office Action dated as mailed on Feb. 5, 2009 for related U.S. Appl. No. 11/330,688, 13 pages.
U.S. Patent and Trademark Office, Office Action dated as mailed on Nov. 28, 2008 for related U.S. Appl. No. 11/927,135, 10 pages.
U.S. Patent and Trademark Office, Office Action dated as mailed on Dec. 12, 2008 for related U.S. Appl. No. 12/169,806, 10 pages.
"oxidation", Apr. 11, 2005, http://www.answers.com/topic/oxidation, definition 1, 4 pages.
"Oxidation and Reduction", Dec. 25, 2003, http://hyperphysics.phy-ast.gsu.edu/HBASE/chemical/oxred.html, 4 pages.
U.S. Patent and Trademark Office, Office Action dated as mailed on Feb. 19, 2009 for related U.S. Appl. No. 11/680,083, 15 pages.
U.S. Patent and Trademark Office, Office Action dated as mailed on Mar. 10, 2009 for related U.S. Appl. No. 11/360,345, 8 pages.
U.S. Patent and Trademark Office, Office Action dated as mailed on Mar. 11, 2009 for related U.S. Appl. No. 12/117,232, 14 pages.
U.S. Patent and Trademark Office, Office Action dated as mailed on Apr. 7, 2009 for related U.S. Appl. No. 11/764,571.
Office Action issued in a related U.S. Appl. No. 11/330,689; dated as mailed on Nov. 5, 2008; 6 pages; U.S. Patent and Trademark Office.
Notice of Allowance issued in a related U.S. Appl. No. 11/340,752; dated as mailed on Oct. 3, 2008; 6 pages; U.S. Patent and Trademark Office.
Office Action issued in a related U.S. Appl. No. 11/330,688; dated as mailed on Aug. 12, 2008; 12 pages; U.S. Patent and Trademark Office.
J. Ruzyllo. Semiconductor Glossary [online], [retrieved on Nov. 12, 2008]. Retrieved from the Internet <URL: http://www.semiconductorglossary.com/default.asp?searchterm=sub-collector+contact>.
J. Ruzyllo. Semiconductor Glossary [online], [retrieved on Nov. 12, 2008]. Retrieved from the Internet <URL: http://www.semiconductorglossary.com/default.asp?searchterm=channel+stop>.
U.S. Patent and Trademark Office, Office Action dated as mailed on May 12, 2009 for related U.S. Appl. No. 11/927,135.
Office Action issued in related U.S. Appl. No. 11/330,689; dated May 14, 2009.
U.S. Patent and Trademark Office, Office Action dated as mailed on Jun. 22, 2009 for related U.S. Appl. No. 12/169,806.
U.S. Patent and Trademark Office, Office Action dated as mailed on Jul. 2, 2009 for related U.S. Appl. No. 11/330,688.
Notice of Allowance issued in related U.S. Appl. No. 11/330,689; dated as mailed on Sep. 4, 2009: U.S. Patent and Trademark Office.
U.S. Patent and Trademark Office, Notice of Allowance dated as mailed on Sep. 28, 2009 for related U.S. Appl. No. 11/764,571.
U.S. Patent and Trademark Office, Notice of Allowance dated as mailed on Aug. 25, 2009 for related U.S. Appl. No. 11/927,135.
U.S. Patent and Trademark Office, final Office Action dated as mailed on Oct. 9, 2009 for related U.S. Appl. No. 11/680,083,.

* cited by examiner

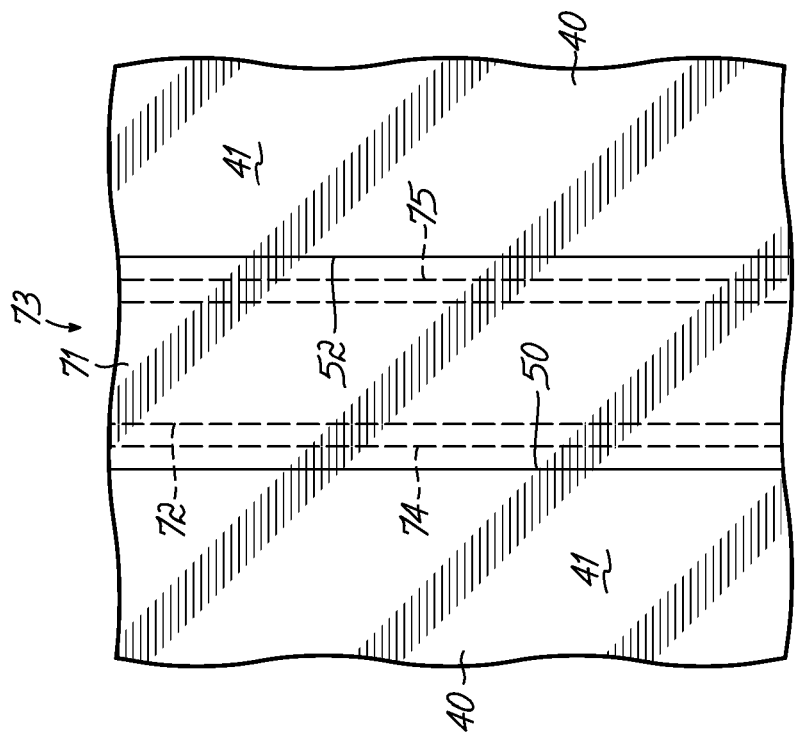
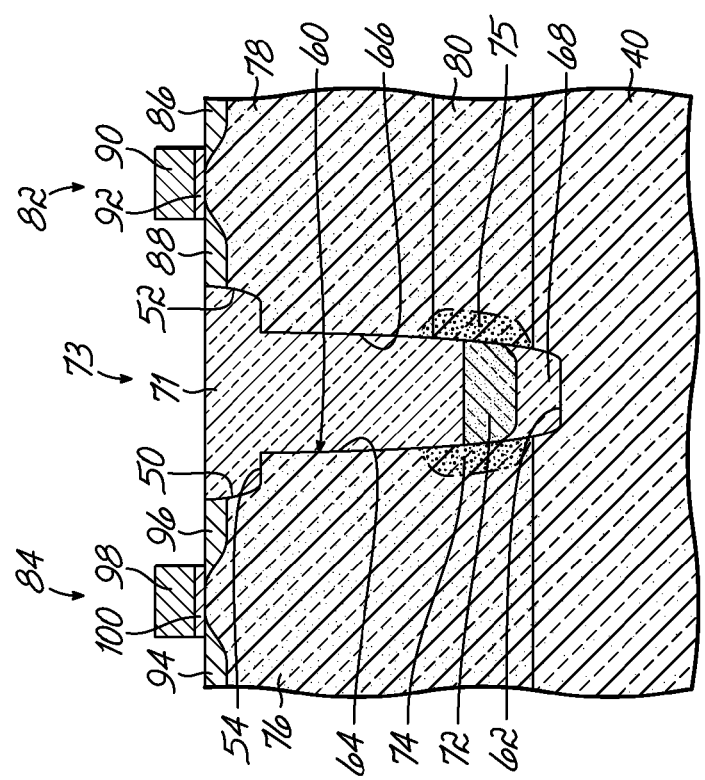

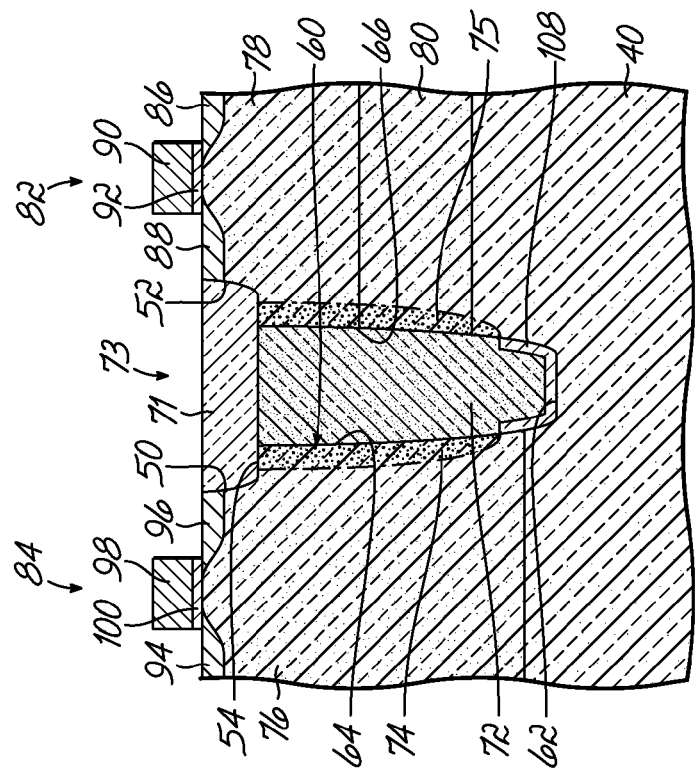
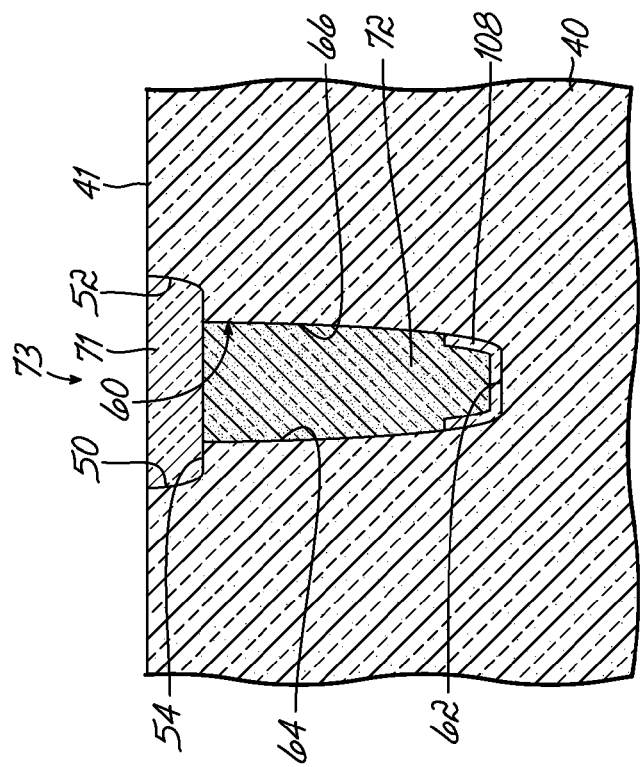

METHODS AND SEMICONDUCTOR STRUCTURES FOR LATCH-UP SUPPRESSION USING A CONDUCTIVE REGION

CROSS-REFERENCE TO RELATED APPLICATIONS

This application is a divisional of application Ser. No. 11/340,752, filed Jan. 26, 2006, which is hereby incorporated by reference herein in its entirety.

FIELD OF THE INVENTION

The invention relates generally to semiconductor structures and methods and, in particular, to semiconductor structures for reducing or suppressing latch-up in bulk complementary metal-oxide-semiconductor device structures and methods for fabricating these semiconductor structures.

BACKGROUND OF THE INVENTION

Complementary metal-oxide-semiconductor (CMOS) technologies integrate P- and N-channel field effect transistors (FETs) to form an integrated circuit on a single semiconductor substrate. Latch-up, which is precipitated by unwanted transistor action of parasitic bipolar transistors inherently present in bulk CMOS devices, may be a significant issue for bulk CMOS technologies. The unwanted parasitic transistor action, which has various triggers, may cause failure of bulk CMOS devices. For space-based applications, latch-up may be induced by the impingement of high energy ionizing radiation and particles (e.g., cosmic rays, neutrons, protons, alpha particles). Because the integrated circuit cannot be easily replaced in space flight systems, the chip failure may prove catastrophic. Hence, designing bulk CMOS devices with a high tolerance to latch-up is an important consideration for circuit operation in the natural space radiation environment, as well as military systems and high reliability commercial applications.

Bulk CMOS device designs may be adjusted to increase latch-up immunity. For example, latch-up immunity may be increased in 0.25 micron device technologies by building bulk CMOS devices on epitaxial substrates (e.g., a p-type epitaxial layer on a highly-doped p-type substrate wafer). Highly-doped substrate wafers provide excellent current sinks for currents that, if unabated, may initiate latch-up. However, epitaxial substrates are expensive to produce and may increase the design complexity of several critical circuits, such as electrostatic discharge (ESD) protective devices.

Guard ring diffusions represent another conventional approach for suppressing latch-up. However, guard ring diffusions are costly because they occupy a significant amount of active area silicon real estate. In addition, although guard ring diffusions collect a majority of the minority carriers in the substrate, a significant fraction may escape collection underneath the guard ring diffusion.

Semiconductor-on-insulator (SOI) substrates are recognized by the semiconductor community as generally free of latch-up. However, CMOS devices are expensive to fabricate on an SOI substrate, as compared to a bulk substrate. Furthermore, SOI substrates suffer from various other radiation-induced failure mechanisms aside from latch-up. Another disadvantage is that SOI devices do not generally come with a suite of ASIC books that would enable simple assembly of low-cost designs.

Conventional CMOS devices are susceptible to latch-up generally because of the close proximity of N-channel and P-channel devices. For example, a typical CMOS device fabricated on a p-type substrate includes a P-channel transistor fabricated in an N-well and an N-channel transistor fabricated in a P-well. The opposite conductivity N- and P-wells are separated by only a short distance and adjoin across a well junction. This densely-packed bulk CMOS structure inherently forms a parasitic lateral bipolar (PNP) structure and parasitic vertical bipolar (NPN) structure. Latch-up may occur due to regenerative feedback between these PNP and NPN structures.

With reference to FIG. 1, a portion of a standard triple-well bulk CMOS structure 30 (i.e., CMOS inverter) includes a P-channel transistor 10 formed in an N-well 12 of a substrate 11, an N-channel transistor 14 formed in a P-well 16 of the substrate 11 that overlies a buried N-band 18, and a shallow trench isolation (STI) region 20 separating the N-well 12 from the P-well 16. Other STI regions 21 are distributed across the substrate 11. The N-channel transistor 14 includes n-type diffusions representing a source 24 and a drain 25. The P-channel transistor 10 has p-type diffusions representing a source 27 and a drain 28. The N-well 12 is electrically coupled by a contact 19 with the standard power supply voltage ($V_{dd}$) and the P-well 16 is electrically coupled by a contact 17 to the substrate ground potential. The input of the CMOS structure 30 is connected to a gate 13 of the P-channel transistor 10 and to a gate 15 of the N-channel transistor 14. The output of CMOS structure 30 is connected to the drain 28 of the P-channel transistor 10 and the drain 25 of the N-channel transistor 14. The source 27 of the P-channel transistor 10 is connected to $V_{dd}$ and the source 24 of the N-channel transistor 14 is coupled to ground. Guard ring diffusions 34, 36 encircle the CMOS structure 30.

The n-type diffusions constituting the source 24 and drain 25 of the N-channel transistor 14, the isolated P-well 16, and the underlying N-band 18 constitute the emitter, base, and collector, respectively, of a vertical parasitic NPN structure 22. The p-type diffusions constituting the source 27 and drain 28 of the P-channel transistor 10, the N-well 12, and the isolated P-well 16 constitute the emitter, base, and collector, respectively, of a lateral parasitic PNP structure 26. Because the N-band 18 constituting the collector of the NPN structure 22 and the N-well 12 constituting the base of the PNP structure 26 are shared and the P-well 16 constitutes the base of the NPN structure 22 and also the collector of the PNP structure 26, the parasitic NPN and PNP structures 22, 26 are wired to result in a positive feedback configuration.

A disturbance, such as impinging ionizing radiation, a voltage overshoot on the source 27 of the P-channel transistor 10, or a voltage undershoot on the source 24 of the N-channel transistor 14, may result in the onset of regenerative action. This results in negative differential resistance behavior and, eventually, latch-up of the bulk CMOS structure 30. In latch-up, an extremely low-impedance path is formed between emitters of the vertical parasitic NPN structure 22 and the lateral parasitic PNP structure 26, as a result of the bipolar bases being flooded with carriers. The low-impedance state may precipitate catastrophic failure of that portion of the integrated circuit. The latched state may only be exited by removal of, or drastic lowering of, the power supply voltage below the holding voltage. Unfortunately, irreversible damage to the integrated circuit may occur almost instantaneously with the onset of the disturbance so that any reaction to exit the latched state is belated.

What is needed, therefore, is a semiconductor structure and fabrication method for modifying standard bulk CMOS device designs that suppresses latch-up, while being cost effective to integrate into the process flow, and that overcomes the disadvantages of conventional bulk CMOS semiconductor structures and methods of manufacturing such bulk CMOS semiconductor structures.

SUMMARY OF THE INVENTION

The present invention is generally directed to semiconductor structures and methods that improve latch-up immunity or suppression in standard bulk CMOS device designs, while retaining cost effectiveness for integration into the process flow forming the P-channel and N-channel field effect transistors characteristic of bulk CMOS devices. In accordance with an embodiment of the present invention, a semiconductor structure comprises a substrate of a semiconductor material and first and second doped wells formed in the semiconductor material of the substrate. The second doped well is disposed adjacent to the first doped well. A trench, which includes a base and first sidewalls between the base and the top surface, is defined in the substrate between the first and second doped wells. The trench is partially filled with a conductor material that electrically couples the first and second doped wells.

In accordance with another embodiment of the present invention, a method is provided for fabricating a semiconductor structure in a substrate of semiconductor material having a first doped well and a second doped well adjacent to the first doped well. The method comprises forming a trench in the semiconductor material with first sidewalls disposed between a base of the trench and a top surface of the substrate and partially filling the trench with a first conductive region to establish a conductive path between the first and second doped wells.

BRIEF DESCRIPTION OF THE DRAWINGS

The accompanying drawings, which are incorporated in and constitute a part of this specification, illustrate embodiments of the invention and, together with a general description of the invention given above and the detailed description of the embodiments given below, serve to explain the principles of the invention.

FIGS. 2-8 are diagrammatic views of a portion of a substrate at various fabrication stages of a processing method in accordance with an embodiment of the present invention.

FIG. 8A is a top view of the substrate portion at the fabrication stage of FIG. 8 with the P-channel and N-channel transistors omitted for clarity.

FIGS. 15-20 are diagrammatic views of a portion of a substrate at various fabrication stages of a processing method in accordance with an alternative embodiment of the present invention.

DETAILED DESCRIPTION

Figure 1:
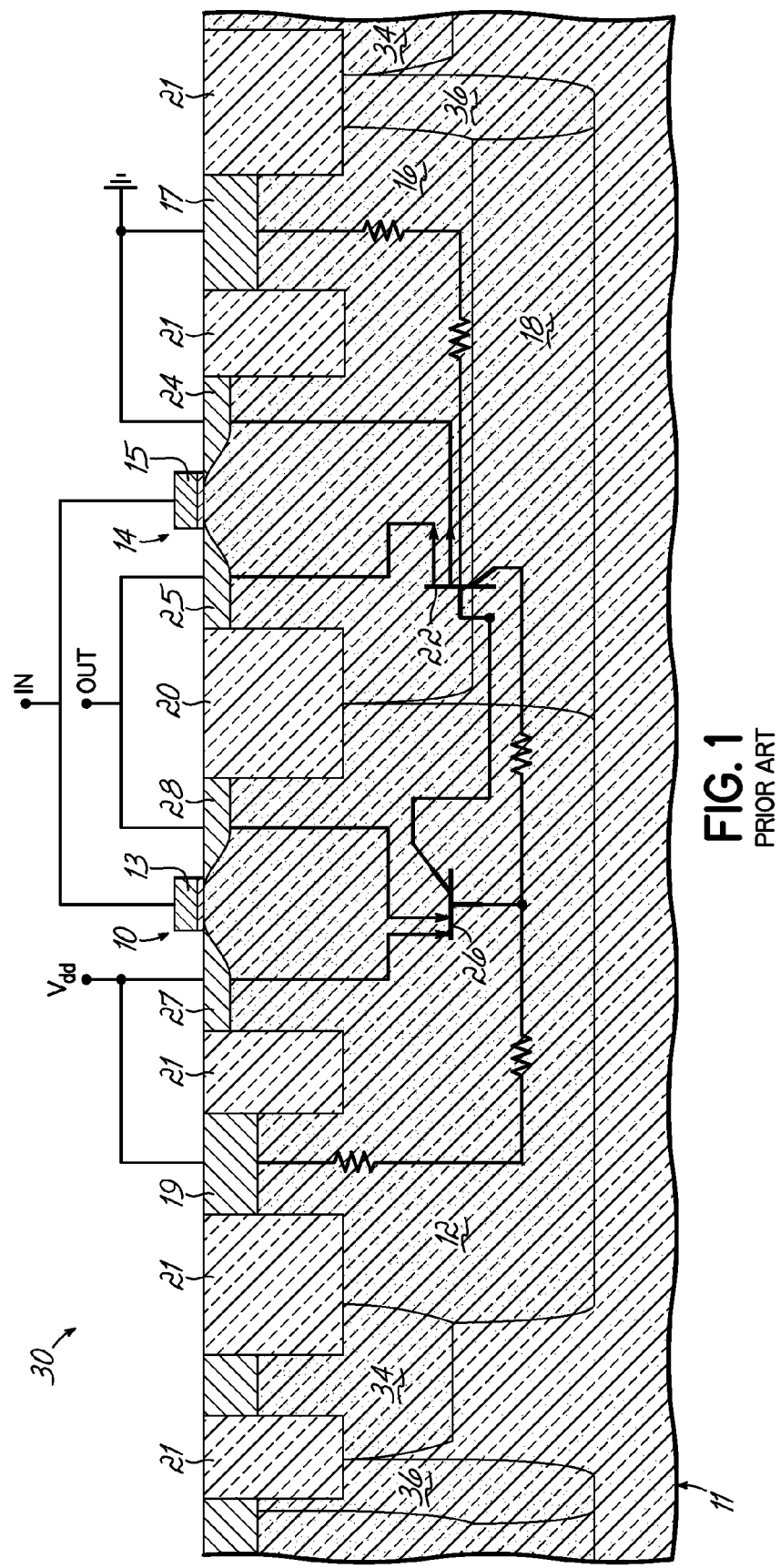
FIG. 1 is a diagrammatic view of a portion of a substrate with a bulk CMOS device constructed in accordance with the prior art.

The present invention provides an isolation region that limits the effect of the vertical parasitic NPN structure and the lateral parasitic PNP structure responsible for latch-up in triple-well bulk CMOS devices. The invention is advantageously implemented in the context of bulk CMOS devices where pairs of N-channel and P-channel field effect transistors are formed adjacent to each other in a P-well within an N-band and an N-well, respectively, and the P-well is isolated from the N-well by a shallow trench isolation (STI) region. Specifically, the latchup immunity of a standard bulk CMOS triple well structure is improved by modifying the STI region with a conductive region or bridge that operates to significantly reduce the susceptibility to latch-up. The present invention will now be described in greater detail by referring to the drawings that accompany the present application.

Figure 2:
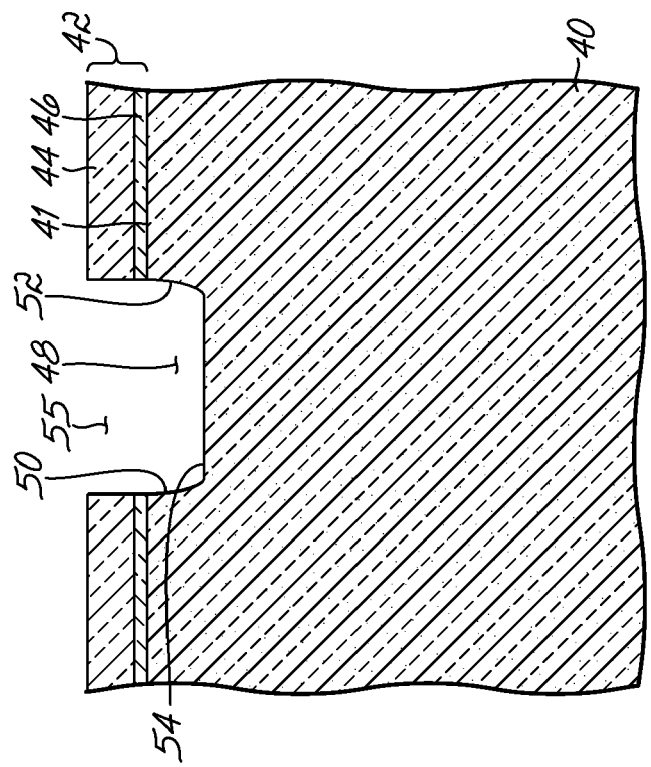

With reference to FIG. 2, a bulk substrate 40 of a monocrystalline semiconductor material is obtained from, for example, a commercial supplier. Substrate 40 may include a low-defect epitaxial layer for device fabrication that is grown by an epitaxial growth process, such as chemical vapor deposition (CVD) using a silicon source gas (e.g., silane). Substrate 40 may be a single crystal silicon wafer containing a relatively light concentration of a dopant providing p-type conductivity. For example, substrate 40 may be lightly doped with $5 \times 10^{15}$ cm$^{-3}$ to $1 \times 10^{17}$ cm$^{-3}$ of a p-type dopant, such as boron, by in situ doping during deposition of the epitaxial layer.

A pad structure 42 is formed on a top surface 41 of the substrate 40. The pad structure 42 includes a first pad layer 44 separated from the substrate 40 by a thinner second pad layer 46. The material(s) forming pad layers 44, 46 advantageously etch selectively to the constituent semiconductor material of substrate 40. The first pad layer 44 may be a conformal layer of nitride ($Si_3N_4$) formed by a thermal CVD process like low pressure chemical vapor deposition (LPCVD) or a plasma-assisted CVD process. The second pad layer 46, which may be silicon oxide ($SiO_2$) grown by exposing substrate 40 to either a dry oxygen ambient or steam in a heated environment or deposited by a thermal CVD process, may operate as a buffer layer to prevent any stresses in the material constituting the first pad layer 44 from causing dislocations in the semiconductor material of substrate 40.

A plurality of shallow trenches, of which a representative shallow trench 48 is shown in FIG. 2, are formed in the semiconductor material of substrate 40 by a conventional lithography and subtractive etching process that utilizes a shallow trench pattern imparted in the pad structure 42 or, optionally, in a patterned hard mask (not shown) formed on pad structure 42. The shallow trench pattern may be created in pad structure 42 by applying a photoresist (not shown) on pad layer 44, exposing the photoresist to a pattern of radiation to create a latent shallow trench pattern in the photoresist, and developing the latent shallow trench pattern in the exposed photoresist. An anisotropic dry etching process, such as reactive-ion etching (RIE) or plasma etching, may then be used to transfer the trench pattern from the patterned resist into the pad layers 44, 46. The etching process, which may be conducted in a single etching step or multiple etching steps with different etch chemistries, removes portions of the pad structure 42 visible through the shallow trench pattern in the patterned resist and stops vertically on the substrate 40. After etching is concluded, residual resist is stripped from the pad structure 42 by, for example, plasma ashing or a chemical stripper.

The shallow trench pattern is then transferred from the patterned pad layer 44 into the underlying substrate 40 with an anisotropic dry etching process. The anisotropic dry etching process may be constituted by, for example, RIE, ion beam etching, or plasma etching using an etch chemistry (e.g., a standard silicon RIE process) that removes the constituent semiconductor material of substrate 40 selective to the materials constituting the pad layers 44, 46. The shallow trench 48 defined in the semiconductor material of substrate 40 includes opposite sidewalls 50, 52, which are substantially mutually parallel and oriented substantially perpendicular to the top surface 41 of substrate 40, that extend into the substrate 40 to a bottom surface or base 54. The shallow trench 48 is registered or aligned with a corresponding opening 55 of the shallow trench pattern in the pad structure 42.

Figure 3:
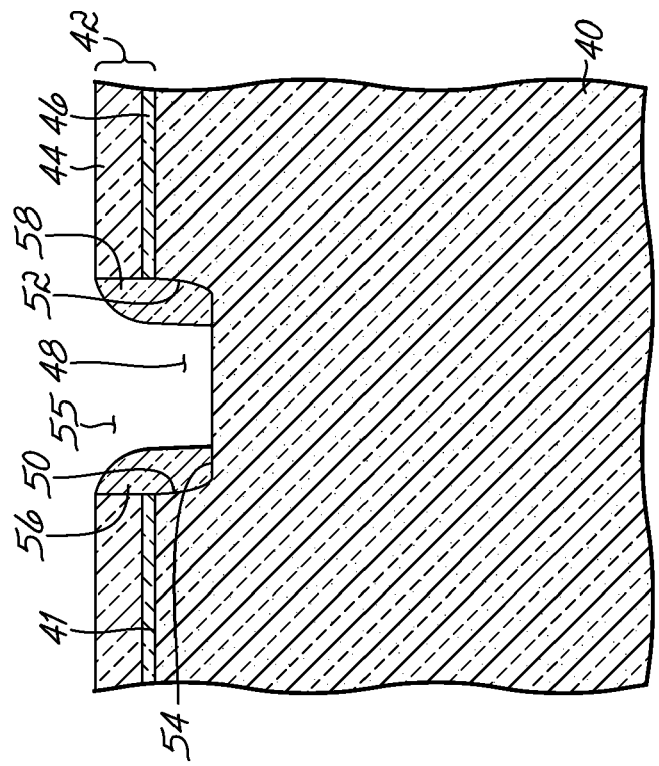

With reference to FIG. 3 in which like reference numerals refer to like features in FIG. 2 and at a subsequent fabrication stage, spacers 56, 58 are formed on the sidewalls 50, 52 of shallow trench 48 and the corresponding aligned opening 55 in the pad structure 42. Spacers 56, 58 may be defined from a conformal layer (not shown) of a dielectric material, such as silicon oxide deposited by a CVD process, that is anisotropically etched using a reactive ion etch (RIE) or plasma etching process to remove the material of the conformal layer primarily from horizontal surfaces selective to (i.e., with a significantly greater etch rate than) the constituent semiconductor material of substrate 40. The base 54 of shallow trench 48 is exposed after the spacers 56, 58 are formed. The semiconductor material of substrate 40 etches selectively to the dielectric material forming the spacers 56, 58, which guides the selection of the dielectric material. A person having ordinary skill will appreciate that additional shallow trenches (not shown), similar to shallow trench 48, defined in the substrate 40 will include spacers (not shown) similar to spacers 56, 58. A block mask (not shown) may be used to cover certain shallow trenches (not shown) in the shallow trench pattern during spacer formation.

Figure 4:
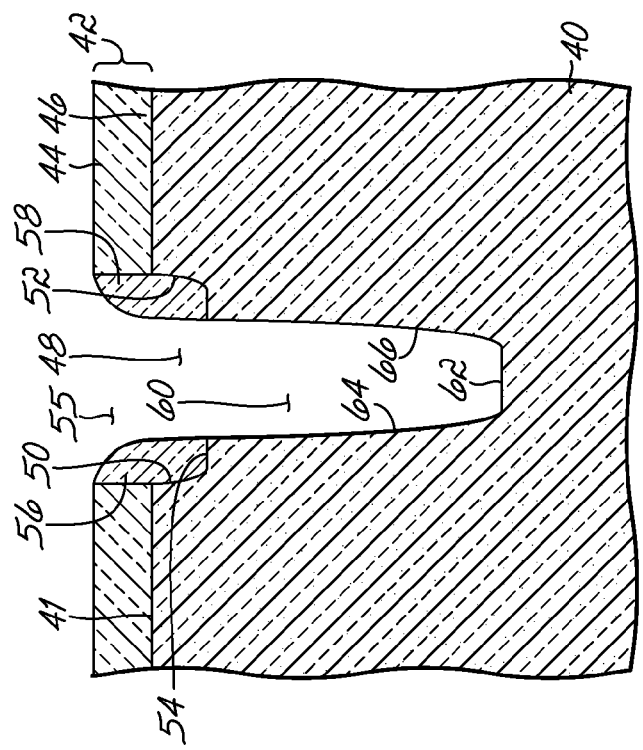

With reference to FIG. 4 in which like reference numerals refer to like features in FIG. 3 and at a subsequent fabrication stage, an anisotropic etching process is used to deepen shallow trench 48, and other shallow trenches similar to trench 48, to define a pigtail or vertical extension 60, also referred to as a deep trench. The vertical extension 60 has a base 62 and sidewalls 64, 66 disposed between base 62 and base 54. The pad structure 42 and the spacers 56, 58 operate as an etch mask for semiconductor material in the covered regions of substrate 40. The absolute depths to which the shallow trench 48 and vertical extension 60 are etched may vary with particular device designs. A person having ordinary skill will appreciate that additional shallow trenches (not shown), similar to shallow trench 48, defined in the substrate 40 will include a vertical extension similar to vertical extension 60. Shallow trenches (not shown) masked by the optional block mask are unaffected by the anisotropic etching process forming vertical extension 60.

Figure 5:
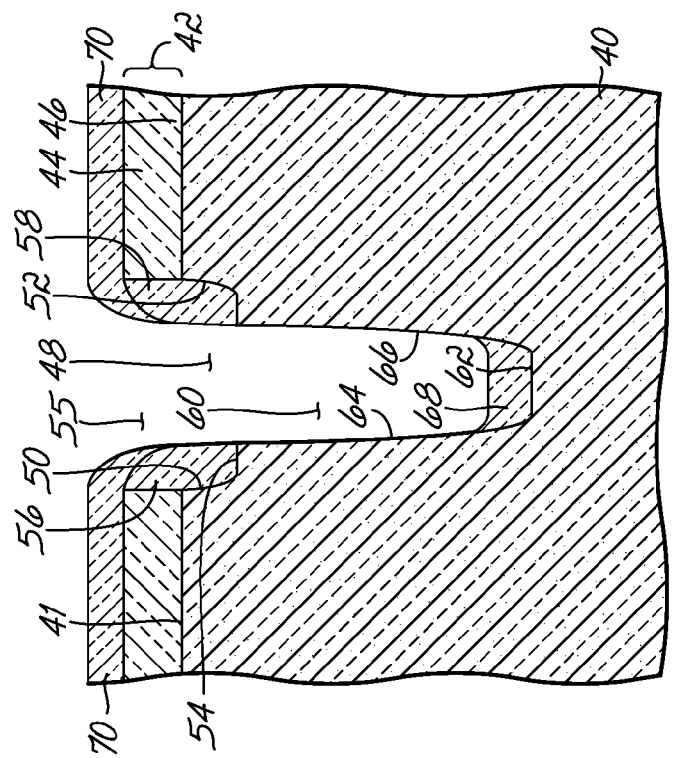

With reference to FIG. 5 in which like reference numerals refer to like features in FIG. 4 and at a subsequent fabrication stage, a dielectric region 68 is formed in the vertical extension 60 adjacent to base 62. The insulating or dielectric material forming the dielectric region 68 may be a high-density plasma (HDP) oxide, which deposits predominantly on horizontal surfaces. An extraneous dielectric layer 70 may be formed across the pad structure 42. Any dielectric material deposited on the vertical surfaces of the spacers 56, 58 or on the sidewalls 64, 66 of vertical extension 60 may be removed by a brief isotropic etching process.

Figure 6:
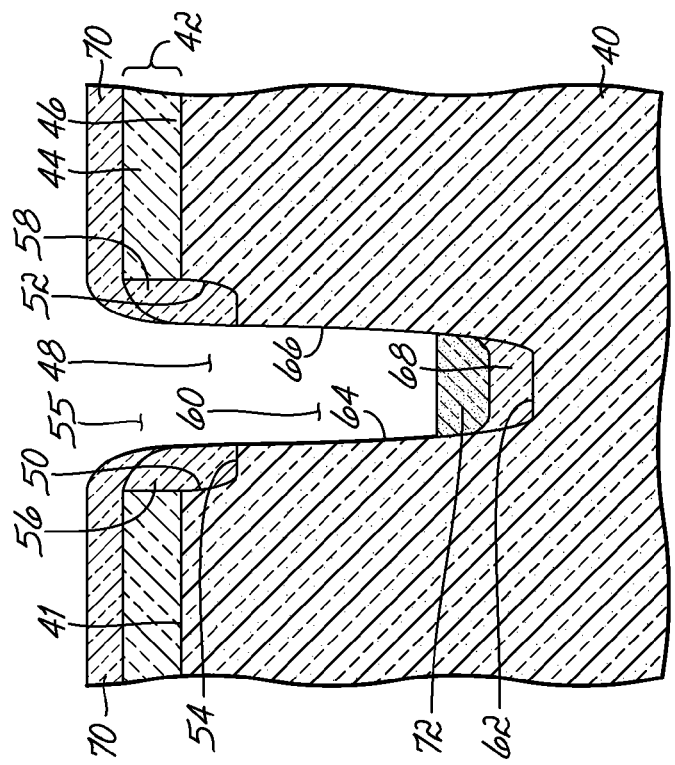

With reference to FIG. 6 in which like reference numerals refer to like features in FIG. 5 and at a subsequent fabrication stage, a conductive bridge or region 72 is formed in the vertical extension 60 such that the dielectric region 68 separates the conductive region 72 from the base 62. The conductive region 72 comprises a portion of a conformal layer of an appropriate conductor or conductive material that is deposited in the vertical extension 60. For example, the conductor constituting the conductive region 72 may be polycrystalline silicon (polysilicon) deposited conformally by a CVD process and in situ doped during the CVD process with a dopant having, for example, an n-type conductivity. The dopant in polysilicon may be, for example, arsenic or phosphorus. Although the invention is not so limited, persons having ordinary skill in the art can appreciate that arsenic may be advantageous for use in doping the conductive material of conductive region 72 because of the relatively low diffusion rate for arsenic in silicon. Other shallow trenches (not shown) in the shallow trench pattern having vertical extensions similar to vertical extension 60 will likewise receive a conductive region similar to conductive region 72.

Portions of the conformal conductor layer overlying dielectric layer 70 are removed by a planarization process, such as a chemical-mechanical polishing (CMP) process. The top surface of dielectric layer 70 operates as a vertical polish stop for the planarization process. After planarization, the depth of a top surface of conductive region 72 is recessed vertically within the vertical extension 60 by an anisotropic dry etching process, such as an RIE or plasma etching process, that removes the constituent conductor of the conductive region 72 selective to the materials constituting the substrate 40 and dielectric layer 70. The top surface of the conductive region 72 is significantly recessed below the top surface 41 of substrate 40. The vertical extent of the conductive region 72 may vary according to the device design. A change in the vertical extent of the conductive region 72 results in a modification of the vertical extent of the conductive regions 74, 75 (FIGS. 8, 8A).

Figure 7:
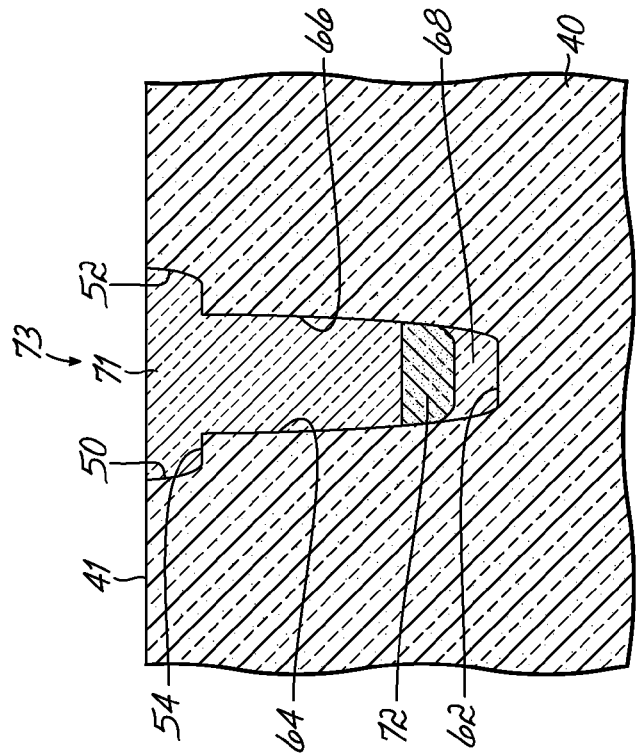

With reference to FIG. 7 in which like reference numerals refer to like features in FIG. 6 and at a subsequent fabrication stage, a dielectric region 71 is formed by filling the open volume in the vertical extension 60 above the conductive region 72 and the open volume in the shallow trench 48 with an insulator or dielectric material, such as HDP oxide or tetraethylorthosilicate (TEOS). The dielectric material filling the previously open volumes in vertical extension 60 and shallow trench 48 may originate from a deposited layer that is planarized to the top surface of the pad structure 42 by, for example, a CMP process. A high temperature process step may be used to densify the TEOS fill. The top surface 41 of substrate 40 is exposed by removing pad structure 42 using a suitable process.

The dielectric regions 68, 71 and the conductive region 72 collectively constitute an isolation region 73. Other isolation regions (not shown), similar to isolation region 73, are formed concurrently with isolation region 73 as the dielectric material of dielectric region 71 fills the other shallow trenches (not shown) in the shallow trench pattern and the associated vertical extension, similar to vertical extension 60.

With reference to FIGS. 8 and 8A in which like reference numerals refer to like features in FIG. 7 and at a subsequent fabrication stage, standard bulk CMOS processing follows, which includes formation of a triple-well structure consisting of an N-well 76, a P-well 78, and a deep buried N-well or N-band 80 in the substrate 40. The buried N-band 80 supplies electrical isolation for the P-well 78. This triple-well construction permits the optimization of bias potentials for both N- and P-wells 76, 78. The P-well 78 is arranged between the N-band 80 and the top surface 41 of substrate 40.

The N-band 80, as well as other N-bands (not shown) dispersed across the substrate 40, are formed by patterning a mask layer (not shown), such as a photoresist, applied on the top surface 41 and implanting an appropriate n-conductivity type impurity into the substrate 40 in this set of unmasked regions. The P-well 78, as well as other P-wells (not shown) dispersed across the substrate 40, are likewise formed by patterning another mask layer (not shown) applied on top surface 41 and implanting an appropriate p-conductivity type impurity into the substrate 40 in this set of unmasked regions. Typically, the P-well 78 is formed by counterdoping the N-band 80 and has an opposite conductivity type from the N-well 76 and N-band 80. The N-well 76, as well as other N-wells (not shown) dispersed across the substrate 40, are likewise formed by patterning another mask layer (not shown) applied on the top surface 41 with techniques known in the art and implanting an appropriate n-conductivity type impurity into the substrate 40 in unmasked regions. Generally, the dopant concentration in the N-well 76 ranges from about $5.0 \times 10^{17}$ cm$^{-3}$ to about $7.0 \times 10^{18}$ cm$^{-3}$, the dopant concentration in the P-well 78 ranges from about $5.0 \times 10^{17}$ cm$^{-3}$ to about $7.0 \times 10^{18}$ cm$^{-3}$, and the dopant concentration in the N-band 80 ranges from about $5.0 \times 10^{17}$ cm$^{-3}$ to about $7.0 \times 10^{18}$ cm$^{-3}$. A thermal anneal may be required to electrically activate the implanted impurities operating as the p-type and n-type dopants.

An N-channel transistor 82 is built using the P-well 78 and a P-channel transistor 84 is built using the N-well 76 to define a bulk CMOS device. The N-channel transistor 82 includes n-type diffusions in the semiconductor material of substrate 40 representing a source region 86 and a drain region 88 that flank opposite sides of a channel region in the semiconductor material of substrate 40, a gate electrode 90 overlying the channel region, and a gate dielectric 92 electrically isolating the gate electrode 90 from the substrate 40. The P-channel transistor 84 includes p-type diffusions in the semiconductor material of substrate 40 representing a source region 94 and a drain region 96 that flank opposite sides of a channel region in the semiconductor material of substrate 40, a gate electrode 98 overlying the channel region, and a gate dielectric 100 electrically isolating the gate electrode 98 from the substrate 40. Other structures, such as sidewall spacers (not shown), may be included in the construction of the N-channel transistor 82 and the P-channel transistor 84.

The conductor used to form the gate electrodes 90, 98 may be, for example, polysilicon, silicide, metal, or any other appropriate material deposited by a CVD process, etc. The source and drain regions 86, 88 and the source and drain regions 94, 96 may be formed in the semiconductor material of substrate 40 by ion implantation of a suitable dopant species having an appropriate conductivity type. The gate dielectrics 92, 100 may comprise any suitable dielectric or insulating material like silicon dioxide, silicon oxynitride, a high-k dielectric, or combinations of these dielectrics. The dielectric material constituting dielectrics 92, 100 may be between about 1 nm and about 10 nm thick, and may be formed by thermal reaction of the semiconductor material of the substrate 40 with a reactant, a CVD process, a physical vapor deposition (PVD) technique, or a combination thereof.

Processing continues to complete the semiconductor structure, including forming electrical contacts to the gate electrodes 90, 98, source region 86, drain region 88, source region 94, and drain region 96. The contacts may be formed using any suitable technique, such as a damascene process in which an insulator is deposited and patterned to open vias, and then the vias are filled with a suitable conductive material, as understood by a person having ordinary skill in the art. The N-channel and P-channel transistors 82, 84 are coupled using the contacts with other devices on substrate 40 and peripheral devices with a multilevel interconnect structure consisting of conductive wiring and interlevel dielectrics (not shown). The N-well 76 is electrically coupled with the standard power supply voltage ($V_{dd}$) and the P-well 78 is electrically coupled with the substrate ground potential.

During high temperature process steps associated with the formation of the semiconductor structure or during a dedicated thermal anneal, conductive regions 74, 75 are formed in the semiconductor material of the substrate 40 adjacent to the conductive region 72. The conductive regions 74, 75, which are formed when the mobile dopant in the conductive region 72 thermally outdiffuses into the semiconductor material of the substrate 40, flank the conductive region 72. The conductive regions 74, 75 possess a higher dopant concentration than either the N-well 76 or the N-band 80. Conductive regions (not shown) similar to conductive regions 74, 75 will form flanking other shallow trenches (not shown) having a conductive region similar to conductive region 72.

In accordance with the principles of the invention, the conductive region 72 bridging vertical extension 60 and the conductive regions 74, 75 in the semiconductor material of substrate 40 flanking conductive region 72 cooperate for bridging the N-well 76 on one side of the isolation region 73 and the N-band 80 on the opposite side of the isolation region 73. Because the base 62 of the vertical extension 60 is deeper than the deepest boundary of the N-well 76 or N-band 80, holes emitted from the source region 94 of the P-channel transistor 84 are directed to the conductive region 72 in the vertical extension 60 and the conductive regions 74, 75 in the semiconductor material of substrate 40 flanking conductive region 72. The holes rapidly recombine with electrons in the conductive region 72, which reduces or eliminates the gain of the lateral parasitic PNP structure 26 (FIG. 1) because a negligible hole current is collected by the P-well 78 and, thereby, suppresses latch-up.

Figure 9:
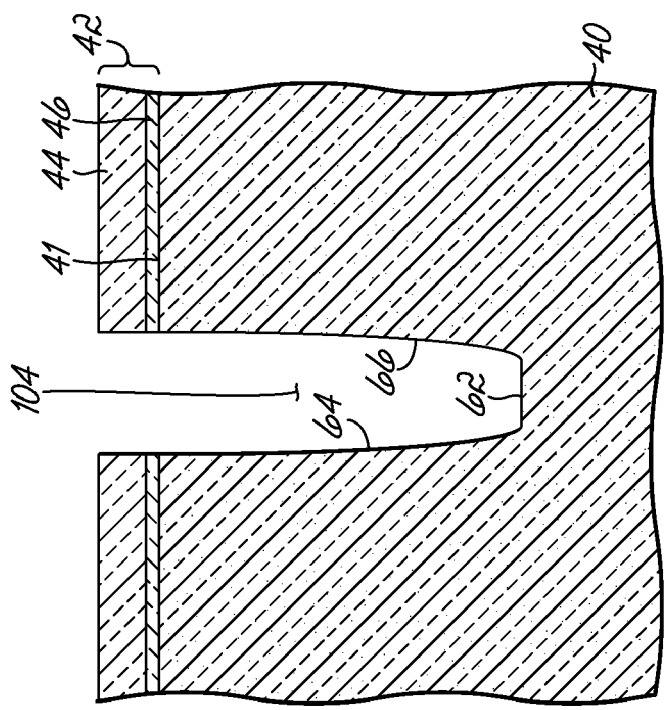

With reference to FIG. 9 in which like reference numerals refer to like features in FIG. 2 and in accordance with an alternative embodiment of the present invention, the vertical extension 60 and conductive region 72 may be formed before the shallow trench 48 is formed and filled with dielectric material to define isolation region 73. To that end, a deep trench 104 is formed in the semiconductor material of substrate 40 using an anisotropic etching process, as described above with regard to the formation of vertical extension 60 in FIG. 4. The anisotropic etching process transfers a deep trench pattern including deep trench 104 from the patterned pad structure 42 to the semiconductor material of the substrate 40. The deep trench pattern includes additional deep trenches (not shown) similar to deep trench 104 and formed at locations distributed across the surface 41 of substrate 40. The patterned pad structure 42 operates as an etch mask for semiconductor material in the covered regions of substrate 40. The absolute depth to which the deep trench 104 is etched may vary contingent upon the particular device design. The lower portion of the deep trench 104 constitutes the vertical extension 60.

Figure 10:
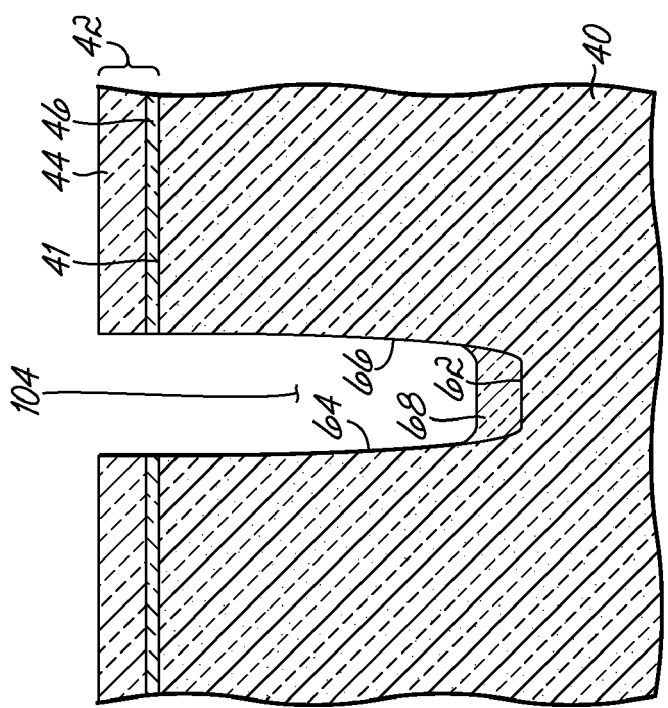
FIGS. 9-14 are diagrammatic views of a portion of a substrate at various fabrication stages of a processing method in accordance with an alternative embodiment of the present invention.

With reference to FIG. 10 in which like reference numerals refer to like features in FIG. 9 and at a subsequent fabrication stage, the dielectric region 68 is formed in the vertical extension 60 adjacent to base 62. As explained above with regard to FIG. 5, the dielectric region 68 is formed by depositing HDP oxide or TEOS in the deep trench 104, planarizing the deposited layer, and recessing the residual planarized dielectric material in the deep trench 104 relative to the top surface 41 of substrate 40.

Figure 11:
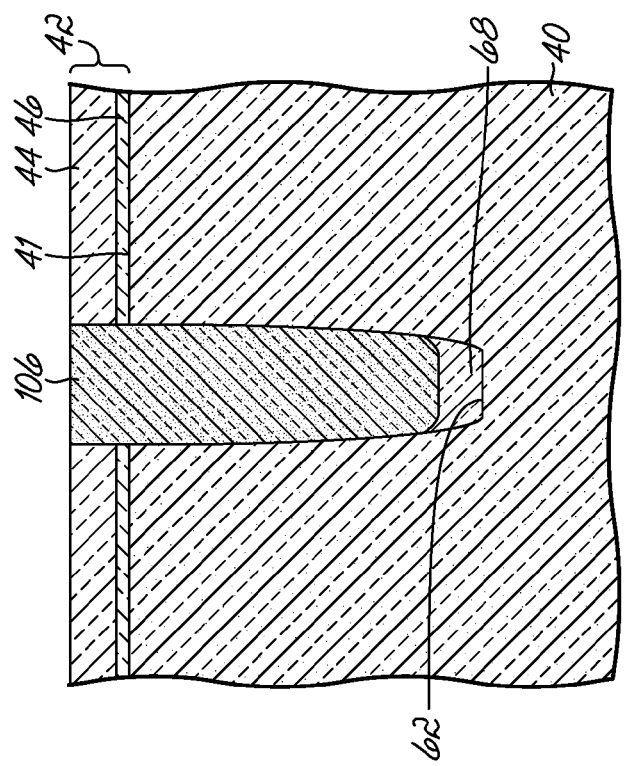

With reference to FIG. 11 in which like reference numerals refer to like features in FIG. 10 and at a subsequent fabrication stage, a conductive plug 106 is formed in the deep trench 104 above the dielectric region 68. The conductive plug 106 comprises a portion of a conformal layer (not shown) constituted by an appropriate conductor or conductive material. The conformal layer may be polysilicon deposited conformally by a CVD process and in situ doped during the CVD process with a dopant having, for example, an n-type conductivity (e.g., arsenic or phosphorus). Extraneous portions of the conformal layer overlying pad structure 42 are removed by a planarization process, such as a chemical-mechanical polishing (CMP) process. The top surface of pad layer 44 operates as a vertical polish stop for the planarization process.

Figure 12:
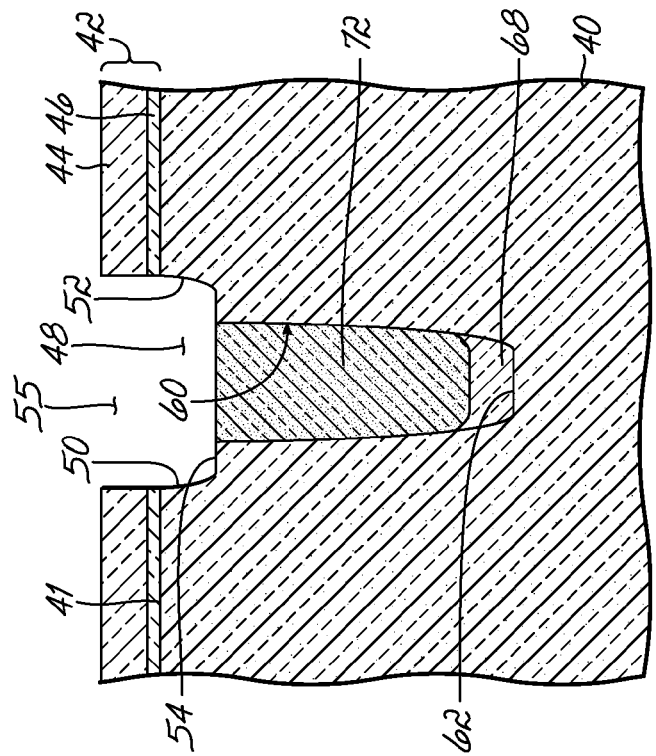

With reference to FIG. 12 in which like reference numerals refer to like features in FIG. 11 and at a subsequent fabrication stage, the shallow trench pattern, which includes shallow trench 48, is formed in the semiconductor material of substrate 40 by a conventional lithography and subtractive etching process, as described above with regard to FIG. 2. Shallow trench 48 is formed in a registered and aligned relationship with deep trench 104 and, hence, completes the formation of vertical extension 60 by shortening the vertical extent of deep trench 104. The trench formation process also removes portions of the conductive plug 106 to create the conductive region 72. The etching process may be conducted in a single etching step or multiple etching steps with different etch chemistries for removing the diverse materials of substrate 40 and conductive plug 106.

Figure 13:
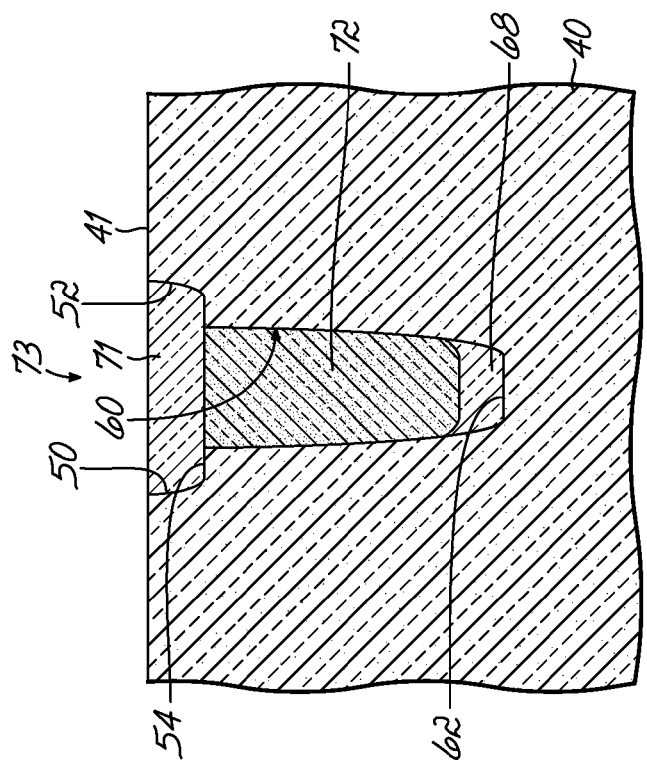

With reference to FIG. 13 in which like reference numerals refer to like features in FIG. 12 and at a subsequent fabrication stage, the isolation region 73 and other isolation regions (not shown) are formed by filling the shallow trench pattern, which includes shallow trench 48, with the dielectric material of dielectric region 71, as described above with regard to FIG. 7. Because the conductive region 72 extends vertically to the horizontal level of the base 54 of shallow trench 48, the dielectric region 71 fails to extend vertically into vertical extension 60, although the invention is not so limited.

Figure 14:
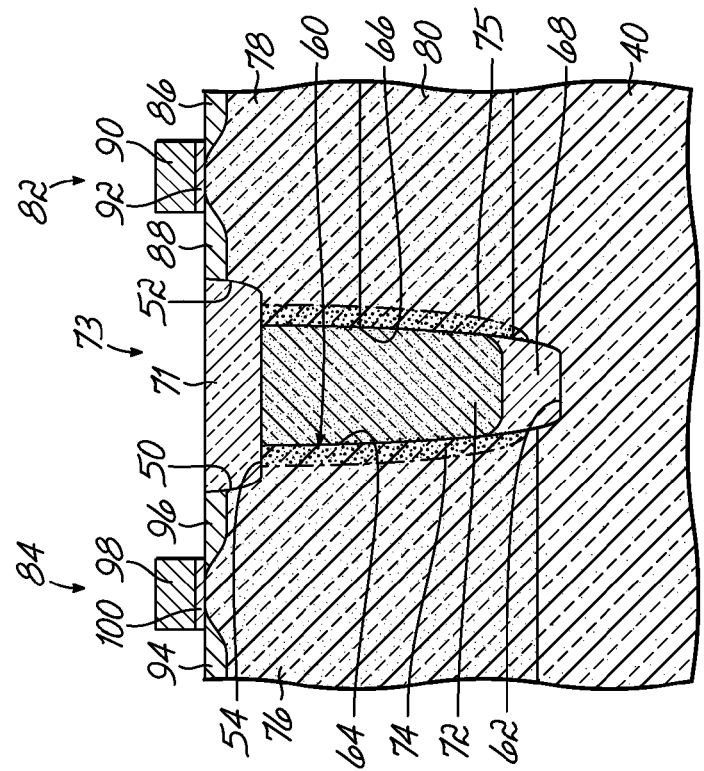

With reference to FIG. 14 in which like reference numerals refer to like features in FIG. 13 and at a subsequent fabrication stage, standard bulk CMOS processing follows, as described above with regard to FIGS. 8 and 8A, that fabricates N-well 76, P-well 78, N-band 80, N-channel transistor 82, and the P-channel transistor 84. The conductive regions 74, 75 are formed in the semiconductor material of substrate 40 in a flanking relationship with conductive region 72 as a consequence of the bulk CMOS processing or a separate thermal annealing step. The conductive region 72, which bridges vertical extension 60, and the conductive regions 74, 75 cooperate for electrically coupling the N-well 76 on one side of the isolation region 73 and the N-band 80 on the other side of the isolation region 73. Because the base 62 of the vertical extension 60 is deeper than the N-well 76 or N-band 80, holes emitted from the source region 94 of the P-channel transistor 84 are directed to the conductive region 72 in the vertical extension 60 and conductive regions 74, 75 in the semiconductor material of substrate 40 flanking conductive region 72.

Figure 15:
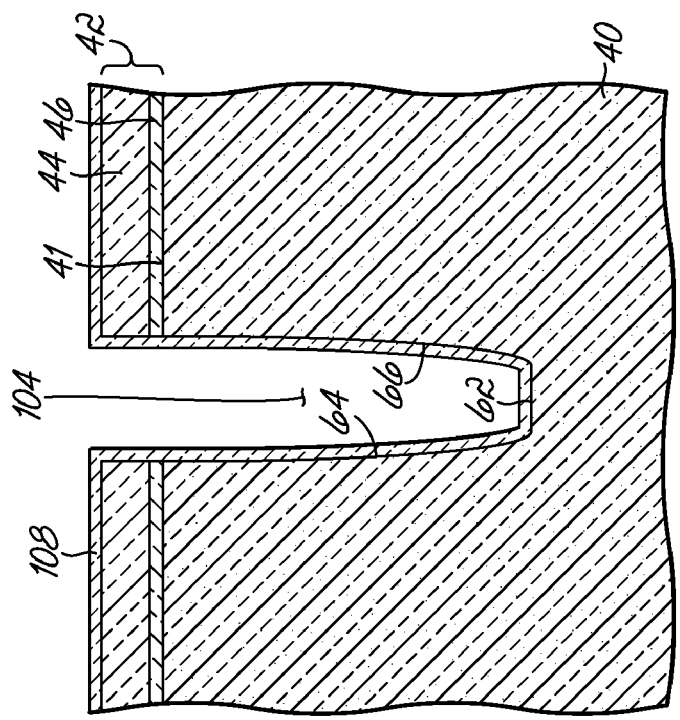

With reference to FIG. 15 in which like reference numerals refer to like features in FIG. 9 and in accordance with an alternative embodiment of the present invention, the deep trench 104 is formed, as described with regard to FIG. 9, and lined with a liner 108 of an insulating material. The liner 108 may be silicon oxide deposited by a CVD process. The liner 108, as explained below, cooperates with the dielectric region 68 and conductive region 72 of isolation region 73 in a manner analogous to dielectric region 68 (FIG. 5) and may be advantageous if the deep trench 104 has a high aspect ratio.

Figure 16:
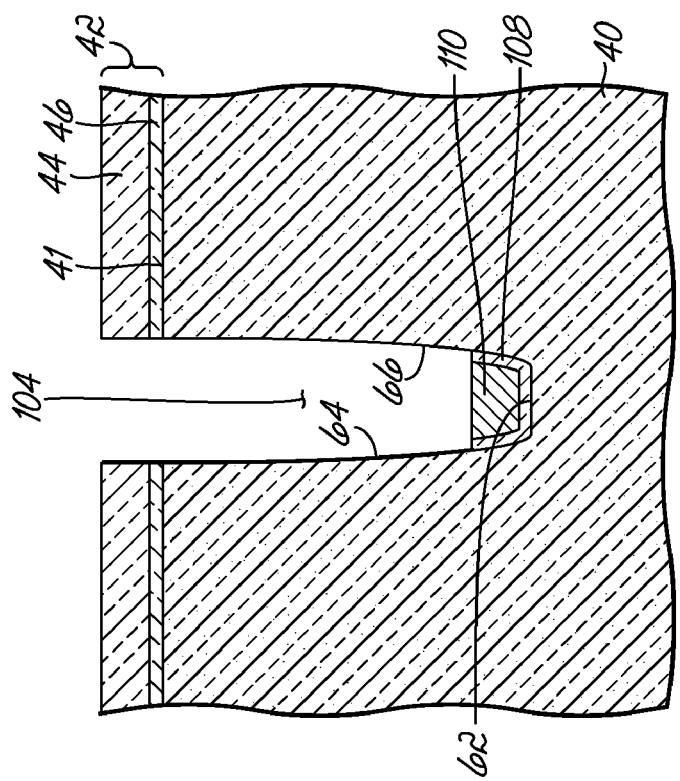
Figure 17:
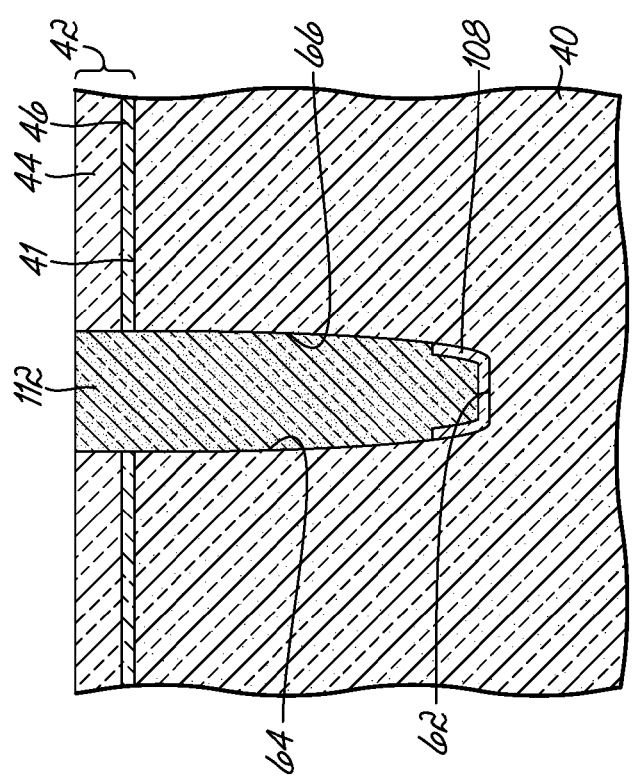

With reference to FIG. 16 in which like reference numerals refer to like features in FIG. 17 and at a subsequent fabrication stage, a temporary plug 110 of an organic material is formed near the base 62 of the vertical extension 60. The temporary plug 110 may be a resist or another organic planarizing material that is deposited inside the deep trench 104 and etched back to reduce the vertical extent. Portions of the liner 108 not masked by the temporary plug 110 are removed from deep trench 104 by an isotropic etching process that removes the liner 108 selective to the semiconductor material of substrate 40.

With reference to FIG. 17 in which like reference numerals refer to like features in FIG. 16 and at a subsequent fabrication stage, the temporary plug 110 of organic material is removed by a suitable process and a conductive plug 112, similar to conductive plug 106, is formed in the deep trench 104, as described above with regard to FIG. 11. Conductive plug 112 is used in a subsequent fabrication stage to form the conductive region 72 (FIG. 18).

Figure 18:
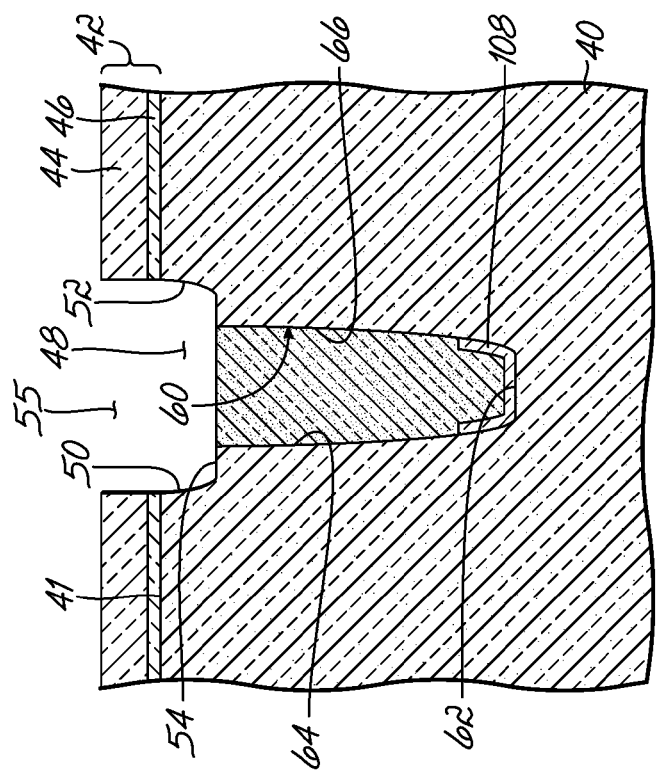

With reference to FIG. 18 in which like reference numerals refer to like features in FIG. 17 and at a subsequent fabrication stage, the shallow trench pattern, which includes shallow trench 48, is formed in the semiconductor material of substrate 40 by a conventional lithography and subtractive etching process as described above with regard to FIG. 2. The shallow trench 48 is formed in a registered and aligned relationship with deep trench 104 and, hence, completes the formation of vertical extension 60. The trench formation process removes portions of the conductive plug 112 to form conductive region 72. The etching process may be conducted in a single etching step or multiple etching steps with different etch chemistries for removing the diverse materials of substrate 40 and conductive plug 112. The liner 108 operates as an electrical insulator between the conductive region 72 and the nearby semiconductor material of the substrate 40 near the base 62 of the vertical extension 60.

With reference to FIG. 19 in which like reference numerals refer to like features in FIG. 18 and at a subsequent fabrication stage, the isolation region 73 and other isolation regions (not shown) are formed by filling the shallow trench pattern, which includes shallow trench 48, with the dielectric material of dielectric region 71, as described above with regard to FIG. 7. Because the conductive region 72 extends vertically to the horizontal level of the base 54 of shallow trench 48, the dielectric region 71 fails to extend vertically into vertical extension 60, although the invention is not so limited.

With reference to FIG. 20 in which like reference numerals refer to like features in FIG. 19 and at a subsequent fabrication stage, standard bulk CMOS processing follows, as described above with regard to FIGS. 8 and 8A, that fabricates N-well 76, P-well 78, N-band 80, N-channel transistor 82, and the P-channel transistor 84. The conductive regions 74, 75 form in the semiconductor material of substrate 40 in a flanking relationship with conductive region 72 as a consequence of the bulk CMOS processing or a separate thermal annealing step. The conductive region 72, which bridges vertical extension 60, and the conductive regions 74, 75 cooperate for electrically coupling the N-well 76 on one side of the isolation region 73 and the N-band 80 on the other side of the isolation region 73. Because the base 62 of the vertical extension 60 is deeper than the N-well 76 or N-band 80, holes emitted from the source region 94 of the P-channel transistor 84 are directed to the conductive region 72 in the vertical extension 60 and conductive regions 74, 75 in the semiconductor material of substrate 40 flanking conductive region 72.

Figure 21:
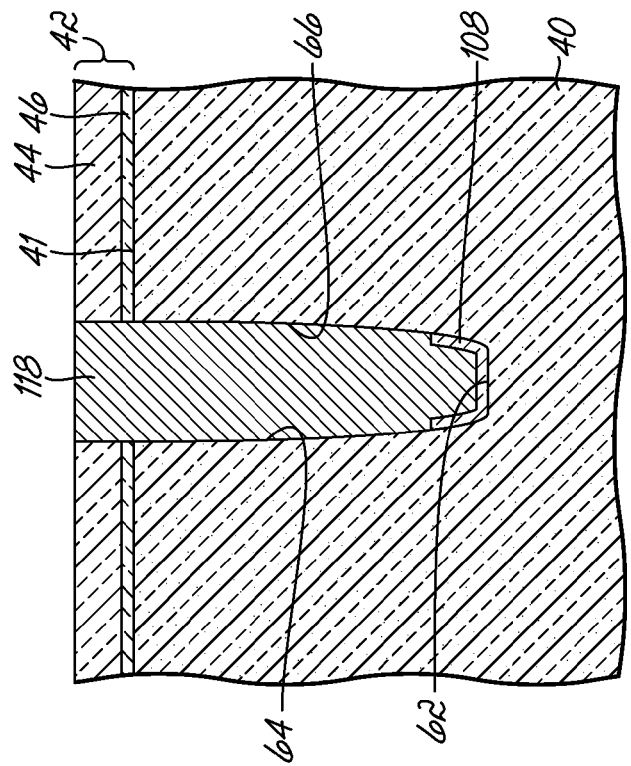
FIGS. 21-25 are diagrammatic views of a portion of a substrate at various fabrication stages of a processing method in accordance with an alternative embodiment of the present invention.

With reference to FIG. 21 in which like reference numerals refer to like features in FIG. 16 and in accordance with an alternative embodiment of the present invention, plug 110 (FIG. 16) is removed by a suitable process and a conductive plug 114, similar to conductive plugs 106 and 112, is formed in the deep trench 104, as described above with regard to FIGS. 11 and 16, respectively. However, the conductive plug 114 partially fills the deep trench 104. A conductive plug 116 of a different conducting material is formed in the upper portion of deep trench 104. Preferably, the conductive material constituting plug 114 is silicon and the conductive material constituting plug 116 is a metal, such as tungsten, that forms a silicide with silicon when subjected to appropriate conditions.

Figure 22:
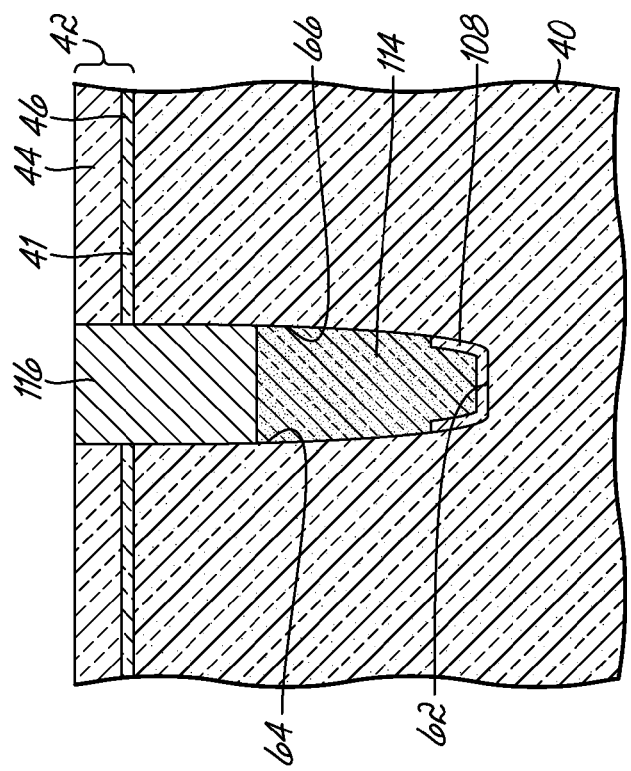

With reference to FIG. 22 in which like reference numerals refer to like features in FIG. 21 and at a subsequent fabrication stage, the conducting materials in plugs 114, 116 are combined to form a fully silicided region 118. The ratio of the conducting materials in plugs 114, 116 determines whether region 118 is fully silicided, as depicted in FIG. 21, or partially silicided. In an alternative embodiment of the present invention, the silicided region 118 may be deposited directly by a suitable deposition process without depositing the individual plugs 114, 116 and promoting formation of silicided region 118 from the plugs 114, 116.

Figure 23:
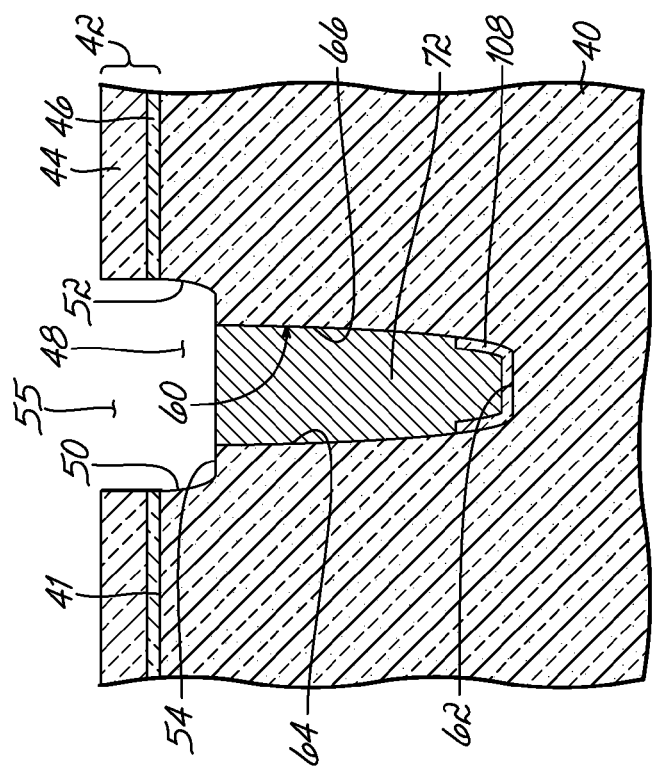

With reference to FIG. 23 in which like reference numerals refer to like features in FIG. 22 and at a subsequent fabrication stage, the shallow trench pattern, which includes shallow trench 48, is formed in the semiconductor material of substrate 40 by a conventional lithography and subtractive etching process, as described above with regard to FIG. 2. The shallow trench 48 is formed in a registered and aligned relationship with deep trench 104 and, hence, completes the formation of vertical extension 60. The trench formation process removes portions of silicided region 118 to form conductive region 72. The etching process may be conducted in a single etching step or multiple etching steps with different etch chemistries for removing the diverse materials of substrate 40 and region 118. For example, a first etching step with an etch chemistry that selectively removes the metal silicide may be used to recess the silicided region 118 relative to the surface 41 of substrate 40 to substantially form conductive region 72, followed by a second etching step with a different etching chemistry that selectively removes the semiconductor material of substrate 40 to form the trench 48.

Figure 24:
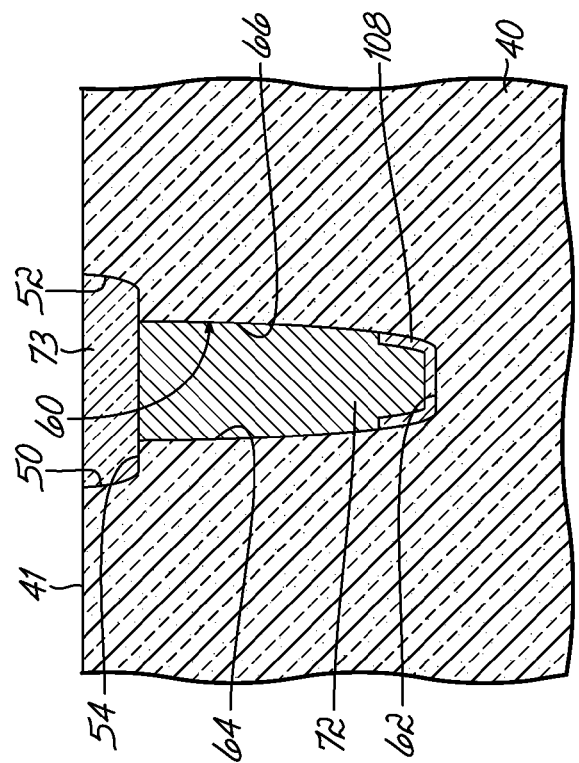

With reference to FIG. 24 in which like reference numerals refer to like features in FIG. 23 and at a subsequent fabrication stage, the isolation region 73 and other isolation regions (not shown) are formed by filling the shallow trench pattern, which includes shallow trench 48, with the dielectric material of dielectric region 71, as described above with regard to FIG. 7. Because the conductive region 72 extends vertically to the horizontal level of the base 54 of shallow trench 48, the dielectric region 71 fails to extend vertically into vertical extension 60, although the invention is not so limited.

Figure 25:
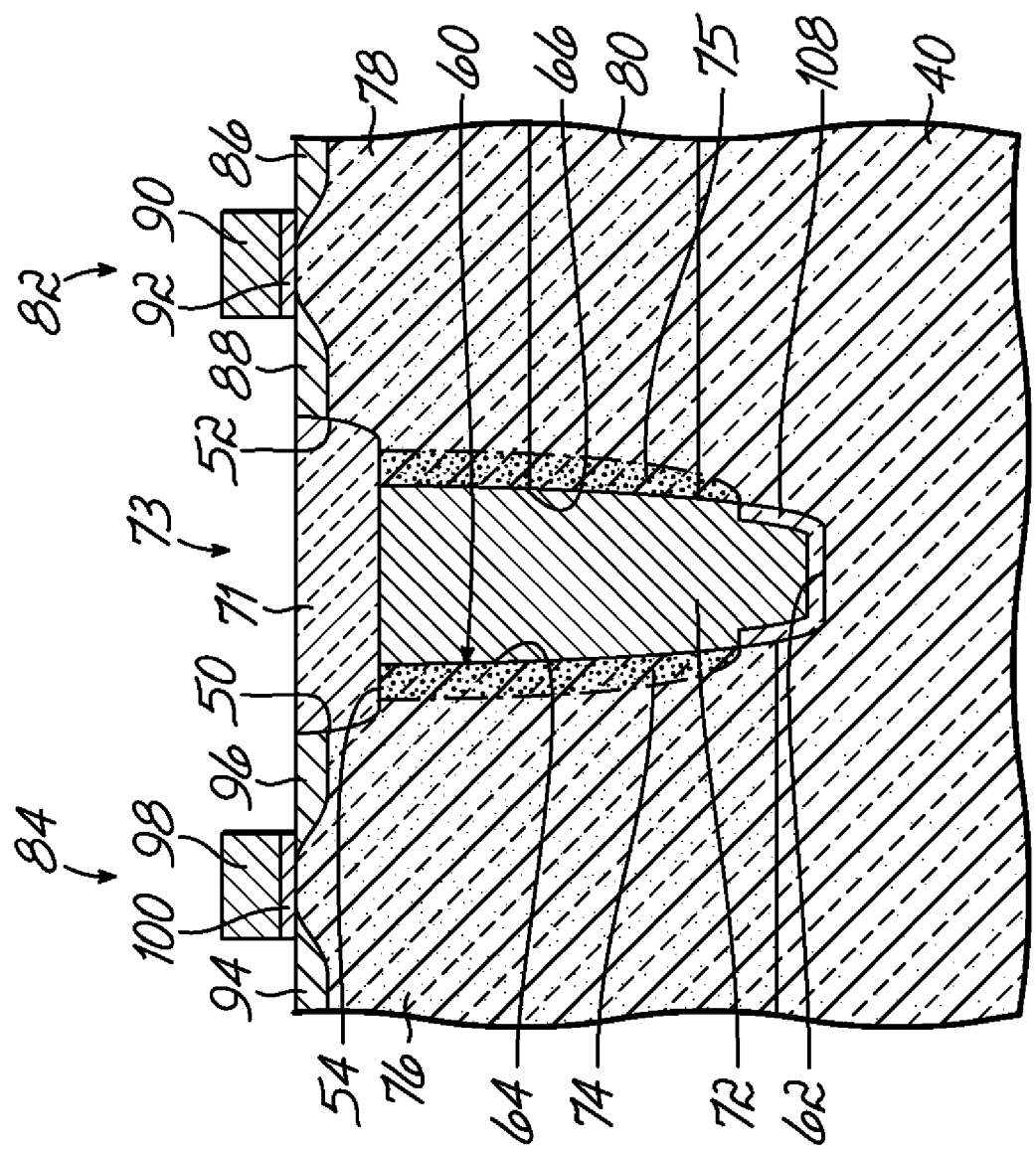

With reference to FIG. 25 in which like reference numerals refer to like features in FIG. 24 and at a subsequent fabrication stage, standard bulk CMOS processing follows, as described above with regard to FIGS. 8 and 8A, that fabricates N-well 76, P-well 78, N-band 80, N-channel transistor 82, and the P-channel transistor 84. The conductive regions 74, 75 form in the semiconductor material of substrate 40 in a flanking relationship with conductive region 72 as a consequence of the bulk CMOS processing or a separate thermal annealing step. The conductive region 72, which bridges vertical extension 60, and the conductive regions 74, 75 cooperate for electrically coupling the N-well 76 on one side of the isolation region 73 and the N-band 80 on the other side of the isolation region 73. Because the base 62 of the vertical extension 60 is deeper than the N-well 76 or N-band 80, holes emitted from the source region 94 of the P-channel transistor 84 are directed to the conductive region 72 in the vertical extension 60 and conductive regions 74, 75 in the semiconductor material of substrate 40 flanking conductive region 72.

References herein to terms such as "vertical", "horizontal", etc. are made by way of example, and not by way of limitation, to establish a frame of reference. The term "horizontal" as used herein is defined as a plane parallel to the top surface 41 of substrate 40, regardless of its actual spatial orientation. The term "vertical" refers to a direction perpendicular to the horizontal, as just defined. Terms, such as "on", "above", "below", "side" (as in "sidewall"), "higher", "lower", "over", "beneath" and "under", are defined with respect to the horizontal plane. It is understood that various other frames of reference may be employed for describing the present invention without departing from the spirit and scope of the present invention.

The fabrication of the semiconductor structure herein has been described by a specific order of fabrication stages and steps. However, it is understood that the order may differ from that described. For example, the order of two or more fabrication steps may be switched relative to the order shown. Moreover, two or more fabrication steps may be conducted either concurrently or with partial concurrence. In addition, various fabrication steps may be omitted and other fabrication steps may be added. It is understood that all such variations are within the scope of the present invention. It is also understood that features of the present invention are not necessarily shown to scale in the drawings.

While the present invention has been illustrated by a description of various embodiments and while these embodiments have been described in considerable detail, it is not the intention of the applicants to restrict or in any way limit the scope of the appended claims to such detail. Additional advantages and modifications will readily appear to those skilled in the art. Thus, the invention in its broader aspects is therefore not limited to the specific details, representative apparatus and method, and illustrative example shown and described. Accordingly, departures may be made from such details without departing from the spirit or scope of applicants' general inventive concept.

What is claimed is:

1. A semiconductor structure comprising:

a substrate of a semiconductor material having a top surface;

a first doped well formed in the semiconductor material of the substrate, the first doped well having a first conductivity type;

a second doped well formed in the semiconductor material of the substrate and disposed adjacent to the first doped well, the second doped well having a first conductivity type;

a third doped well formed in the semiconductor material of the substrate, the third doped well arranged between the second doped well and the top surface, the third doped well having a second conductivity type that differs from the first conductivity type;

a trench defined in the substrate between the first and second doped wells, the trench including a base and a plurality of first sidewalls between the base and the top surface of the substrate;

a first conductive region partially filling the trench, the first conductive region electrically connected with the first doped well along one of the first sidewalls, and the first conductive region electrically connected with the second doped well along another of the first sidewalls; and a first field effect transistor with source and drain regions in the first doped well; and a second field effect transistor with source and drain regions in the third doped well, the first conductive region operating to reduce latch-up of the first and second field effect transistors.

2. The semiconductor structure of claim wherein the first and second doped wells have an n-type conductivity, the third doped well has a p-type conductivity, the source and drain regions of the first field effect transistor comprises p-type diffusions, and the source and drain regions of the second field effect transistor comprise n-type diffusions.

3. The semiconductor structure of claim 1 wherein the first doped well extends to a first depth into the substrate relative to the top surface of the substrate, the second doped well extends to a first depth into the substrate relative to the top surface of the substrate, and the base of the trench extends deeper into the semiconductor material of the substrate than the first and second depths.

4. The semiconductor structure of claim 1 further comprising:

a second conductive region defined in the semiconductor material of the substrate and bordering the first conductive region in the trench, the second conductive region having a higher dopant concentration than the first and second doped wells.

5. A semiconductor structure comprising:

a substrate of a semiconductor material having a top surface;

a first doped well formed in the semiconductor material of the substrate, the first doped well having a first conductivity type;

a second doped well formed in the semiconductor material of the substrate and disposed adjacent to the first doped well, the second doped well a second conductivity type;

a trench defined in the substrate between the first and second doped wells, the trench including a base and a plurality of first sidewalls between the base and the top surface of the substrate;

a first conductive region partially filling the trench, the first conductive region electrically connected with the first doped well along one of the first sidewalls, and the first conductive region electrically connected with the second doped well along another of the first sidewalls; and a first field effect transistor with source and drain regions in the first doped well; and a second field effect transistor with source and drain regions in the second doped well, the first conductive region operating to reduce latch-up of the first and second field effect transistors.

6. The semiconductor structure of claim 5 further comprising:

a second conductive region defined in the semiconductor material of the substrate and bordering the first conductive region in the trench, the second conductive region having a higher dopant concentration than the first and second doped wells.

7. A semiconductor structure comprising:

a substrate of a semiconductor material having a top surface;

a first doped well formed in the semiconductor material of the substrate;

a second doped well formed in the semiconductor material of the substrate and disposed adjacent to the first doped well;

a trench defined in the substrate between the first and second doped wells, the trench including a base, a plurality of first sidewalls between the base and the top surface of the substrate, and a plurality of second sidewalls between the first sidewalls and the top surface, the second sidewalls having a wider separation than the first sidewalls;

a first dielectric region and a second dielectric region each disposed in the trench; and a first conductive region partially filling the trench, the first conductive region electrically connected with the first doped well along one of the first sidewalls, the first conductive region electrically connected with the second doped well along another of the first sidewalls, and the first conductive region bounded between said first and second dielectric regions disposed in the trench.

8. The semiconductor structure of claim 7 wherein the first dielectric region comprises a dielectric liner disposed between the first conductive region and at least the base of the trench.

9. The semiconductor structure of claim 7 wherein the first doped well extends to a first depth into the substrate relative to the top surface of the substrate, the second doped well extends to a first depth into the substrate relative to the top surface of the substrate, and the base of the trench extends deeper into the semiconductor material of the substrate than the first and second depths.

10. The semiconductor structure of claim 7 further comprising:

a second conductive region defined in the semiconductor material of the substrate and bordering the first conductive region in the trench, the second conductive region having a higher dopant concentration than the first and second doped wells.

* * * * *